United States Patent
Marlett

(10) Patent No.: US 7,277,840 B2
(45) Date of Patent: Oct. 2, 2007

(54) METHOD FOR DETECTING BUS CONTENTION FROM RTL DESCRIPTION

(75) Inventor: Ralph Marlett, Redwood City, CA (US)

(73) Assignee: Atrenta, Inc., San Jose, CA (US)

( * ) Notice: Subject to any disclaimer, the term of this patent is extended or adjusted under 35 U.S.C. 154(b) by 806 days.

(21) Appl. No.: 10/172,996

(22) Filed: Jun. 18, 2002

(65) Prior Publication Data
US 2003/0233504 A1    Dec. 18, 2003

(51) Int. Cl.
*G06F 17/50*    (2006.01)

(52) U.S. Cl. ............................ 703/14; 714/811; 716/4

(58) Field of Classification Search ................ 703/14; 714/811; 716/4
See application file for complete search history.

(56) References Cited

U.S. PATENT DOCUMENTS

| | | |
|---|---|---|
| 4,774,084 A | 9/1988 | Magnusson et al. |
| 4,937,827 A | 6/1990 | Beck et al. |
| 5,373,514 A | 12/1994 | Ma |
| 5,872,953 A | 2/1999 | Bailey |
| 5,903,466 A | 5/1999 | Beausang et al. |
| 5,907,698 A | 5/1999 | Kucukcakar et al. |
| 6,018,807 A | 1/2000 | Larson |
| 6,243,777 B1 | 6/2001 | Pawlowski |
| 6,295,636 B1 | 9/2001 | Dupenloup |
| 6,324,657 B1 | 11/2001 | Fister et al. |
| 6,883,134 B2 * | 4/2005 | Maamari et al. ............. 714/811 |
| 2003/0188273 A1 * | 10/2003 | Kundu et al. ................... 716/4 |

* cited by examiner

*Primary Examiner*—Paul Rodriguez
*Assistant Examiner*—Russ Guill
(74) *Attorney, Agent, or Firm*—Sughrue Mion Pllc.

(57) ABSTRACT

A method for efficiently detecting bus contention from a register transfer level (RTL) description is provided. A bus contention occurs if more than two components try to propagate data onto a bus at the same time. The provided method simulates possible input combinations and detects whether there is a possibility for a bus contention. In addition, the provided method is designed for testability, therefore using the method, the designer may identify contention that may exist in test mode at the RTL level of the design even when such conditions may not occur in system mode. The method provides the designer with the input combination as well as the RTL statement that caused the contention. The method detects the bus contention by simulating a small number of input combinations.

45 Claims, 4 Drawing Sheets

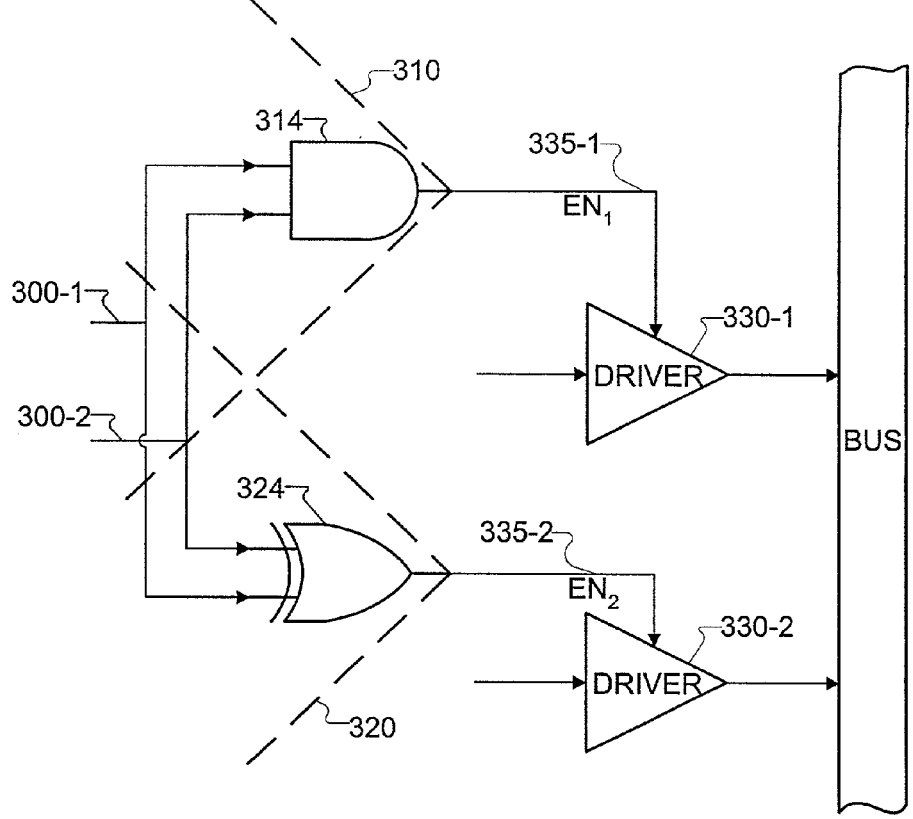

| Sequence | Inputs | | | Driver Enable | | Possible Result |
|---|---|---|---|---|---|---|
| | 400-1 | 400-2 | 400-3 | 435-1 | 435-2 | |
| 0 | 0 | 0 | Ø | 0 | 0 | Float |
| 1 | 0 | 1 | Ø | 0 | 0 | Float |
| 2 | 1 | 0 | Ø | 0 | Ø | Float/OK |
| 3 | 1 | 1 | Ø | 1 | Ø | OK / Contention |

METHOD FOR DETECTING BUS CONTENTION FROM RTL DESCRIPTION

FIELD OF THE INVENTION

The present invention relates generally to the design for testability of ICs, and more specifically to a method that reduces the time and simulation resources needed for verifying testability of an IC, and a computer program product and computer system implementing the same.

BACKGROUND OF THE INVENTION

The complexity of modern integrated circuits (ICs) has led to the development of architecture-based designs, which use high-level design methods to decrease design time. A typical high-level design method uses an algorithmic description of the behavior of an IC to generate a register transfer level (RTL) description of the circuit. The RTL description is an intermediary level of abstraction between the behavioral and structural levels. The RTL description is produced by executing a plurality of design tasks such as scheduling, resource allocation, mapping behavioral statements to specific hardware components, and control unit generation. The design tasks work interdependently to produce a design scheme that represents the IC at multiple architectural levels. In such a design method, design errors can be introduced during the design both by the designer and by the automated design tasks.

Synthesis tools produce gate level netlists based on the RTL statements. Netlists generally include logical gates such as AND, NAND, NOR, OR, XOR, NXOR and so on. When a problem is detected at the gate level, usually, it is not an easy task to relate a gate level problem back to the original RTL code. In large designs, with hundreds of design files and numerous levels of hierarchy, finding in the RTL the precise cause of a gate level violation can be an impractical task.

An important part of the synthesis process involves designing for testability. Programs that aid in the testability process of synthesis are called design for test (DFT) processes. As part of DFT process, certain memory cells in the design scheme are replaced with special memory cells. These special memory cells, called scan cells, are designed to allow the application of test vectors to certain logic portions of the IC. Additionally, the special memory cells can be used to capture the output of the circuitry for observation and compare this output to the expected output in an effort to determine if circuit defects are present.

The portions of an IC that are designed to perform the intended or expected operational function are called its "operational mode" circuitry while the portions added to the IC to facilitate testability are called "test mode" circuitry or DFT implementations. The resultant circuit therefore has two functional modes, operational and test.

Bus contention is a problem that arises in an IC when more than one component contends for utilization of a single bus. Bus contention is a serious design problem, which should be eliminated to ensure that the resulting circuit operates as expected. In certain cases it is further necessary to detect a case where no source drives a bus, causing the bus to "float". Moreover, it may be necessary to detect these conditions not only in normal operation mode but also in test mode, where the circuit behavior may be significantly different.

The conventional technique of detecting bus contention during simulation requires a skilled design or test engineer with knowledge of the waveforms representing the value on the simulated bus at various time intervals. The designer may realize that the abnormality is a result of bus contention. Conventional techniques may display such abnormal waveforms in color to bring the abnormality to the attention of the designer. Problems with this technique may arise if a contention exists only for a short duration.

In U.S. Pat. 4,744,084 (the 084 patent), Beck et al. suggests a system for performing hardware modeling, including that of bus contention. Through use of test vectors and optional timing analyzers they propose to detect design errors through dynamic simulations. Beck et al. suggests additional ideas for such dynamic simulations in U.S. Pat. No. 4,937,827 (the 827 patent).

A method for detecting bus contention during dynamic simulation is further described in U.S. Pat. No. 6,018,807 by Larson (the 807 patent). The method quite simply suggests that a dynamic simulation take place and a counting of the number of active enable signals on drivers to a bus are counted. When more than one is found to be in its active state an error is generated.

A method shown in U.S. Pat. No. 6,295,636 by Dupenloup (the 636 patent) deals with RTL analysis, including cases of contention detection. However, the method still requires simulation for detection of this error condition.

Like all the cases requiring dynamic simulations, these inventions require the extensive use of computer resources and time for performing the simulations. Moreover, the simulations are at best only as good as the coverage that the test vectors used provide, which is most likely unable to achieve a one hundred percent coverage.

Due to the significant amount of computer resources required when simulating circuits it is often advantageous to emulate a circuit on some hardware, for example as suggested by Bailey in U.S. Pat. No. 5,872,953 (the 953 patent). Bailey suggests a method to transform the circuit from its original description into a description that allows for emulation of the same circuit. This of course will result with a significantly accelerated response time.

The quality of the result (i.e., detection of errors) is, however, still limited to the selection of the test vectors and the errors that they may detect. It should be understood that the use of test vectors does not necessarily mean a one hundred percent test coverage.

Since not all the errors can be detected using test vectors, Fister et al in U.S. Pat. No. 6,324,657 (the 657 patent) suggest the inclusion of a hardware circuit as part of an IC for detection of errors, including that of contention. However, the error is to be detected at a very late stage of the design, i.e. in the early manufacturing stage.

Another method of detection involves formal methods but these typically require user setups. Furthermore, such setups may become complex if they are to detect kinds of contention that may happen only in test mode. Kucukcakar et al., in U.S. Pat. No. 5,907,698 (the 698 patent), propose such a method. It involves the comparison of the RTL description to the architectural design rules. If the RTL description is found not to be coherent with the architectural design rules then an error is indicated. These types of checks can detect inconsistencies in architectural implementation, however, they do tend to be complex and are generally less efficient in detecting lower level errors such as potential bus contentions.

Another technique for detecting contention provides a method for determining whether a contention condition exists on a simulated bus by checking whether two or more drivers connected to the bus are active. U.S. Pat. No. 5,373,514 by Ma (the 514 patent) provides additional assistance by adding detection logic connected to both the bus having a contention as well as the enable signals of a driver.

Nevertheless, the operation still requires a dynamic simulation through the use of a plurality of test vectors. Using the method in test mode results in additional complexity as the detection circuitry has to be modified to address this state as well.

Frequently, in order to reduce the complexity of test vectors in test mode, circuits are broken along scan lines. This allows for testing of just portions of the circuit, hence reducing significantly test time and test complexity. U.S. Pat. No. 5,903,466 by Beausang et al. (the 466 patent) suggests such a solution. However, it still does not eliminate the need to dynamically simulate the contention or float situations of a bus, and while complexity was reduced it is available for test mode which is still either time consuming for simulation, or requires tests on the actual or emulated hardware.

A totally different approach is proposed by Pawlowski in U.S. Pat. No. 6,243,777 (the 777 patent). Pawlowski suggests that a circuit be added to the output of two enable signals for detection of a possible contention where both signals enable drivers to drive a single bus. The additional circuit outputs a signal connected to the logic creating one of the enable signals and delaying the output of that driver. While a solution for prevention of contention in some cases, where time separation is a feasible solution, it is not a solution for the general case of detecting and preventing bus contention.

Therefore, it would be advantageous to have a solution that detects bus contention and identifies the contention introduced at an early stage in the design. It would be further advantageous if the provided solution will be DFT compatible, i.e., preventing bus contention in general and in test mode in particular.

SUMMARY OF THE INVENTION

In one aspect of the invention, there is provided a method for determining bus contention and/or float conditions at the RTL level.

In another aspect of the invention, the foregoing method is realized in a computer program product or a computer system.

The invention is taught below by way of various specific exemplary embodiments explained in detail, and illustrated in the enclosed drawing figures.

BRIEF DESCRIPTION OF THE DRAWINGS

The drawing figures depict, in highly simplified schematic form, embodiments reflecting the principles of the invention. Many items and details that will be readily understood by one familiar with this field have been omitted so as to avoid obscuring the invention. In the drawings:

FIG. 3a is an exemplary diagram showing the use of the method of FIG. 2 for detecting bus contention/float conditions.

FIG. 3b is a table showing values at certain points in the circuitry depicted in FIG. 3a.

FIG. 4a is another exemplary diagram showing the use of the method of FIG. 2.

FIG. 4b is a table showing values at certain points in the circuitry depicted in FIG. 4a.

DETAILED DESCRIPTION

Figure 1:
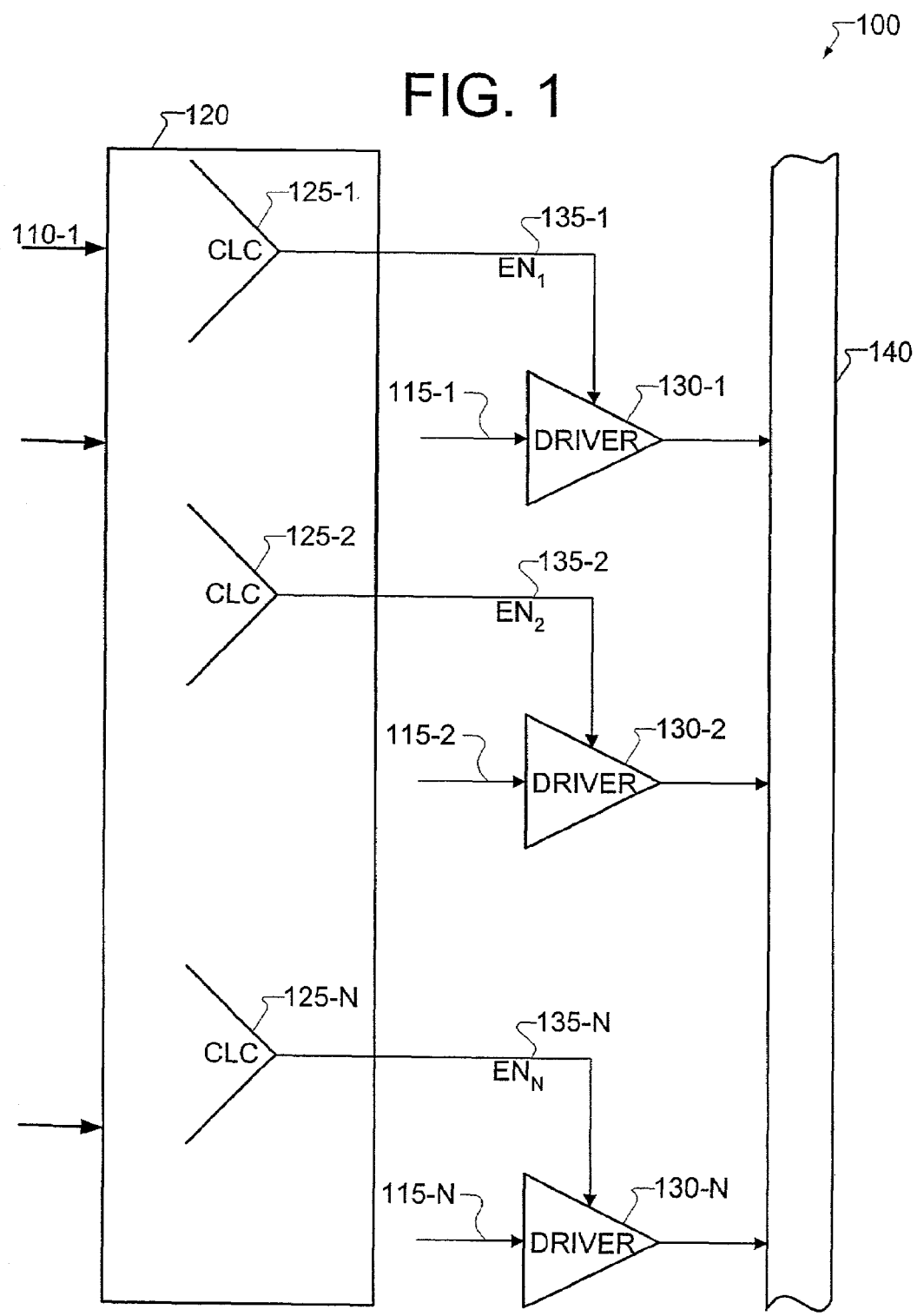
FIG. 1 is a schematic diagram of combinational logic enabling drivers for driving data on a bus.

The invention will now be taught using various exemplary embodiments. Although the embodiments are described in detail, it will be appreciated that the invention is not limited to just these embodiments, but has a scope that is significantly broader. The appended claims should be consulted to determine the true scope of the invention.

As a preliminary step to introducing the exemplary embodiments, certain terms will first be defined.

Computer Systems

One embodiment of this invention resides in a computer system. Here, the term "computer system" is to be understood to include at least a memory and a processor. In general, the memory will store, at one time or another, at least portions of an executable program code, and the processor will execute one or more of the instructions included in that executable program code. It will be appreciated that the term "executable program code" and the term "software" mean substantially the same thing for the purposes of this description. It is not necessary to the practice of this invention that the memory and the processor be physically located in the same place. That is to say, it is foreseen that the processor and the memory might be in different physical pieces of equipment or even in geographically distinct locations as in the case of a client/server or a distributed processing environment.

Computer Program Products

The above-identified invention may be embodied in a computer program product, as will now be explained.

On a practical level, the software that enables the computer system to perform the operations described further below in detail, may be supplied on any one of a variety of media. Furthermore, the actual implementation of the approach and operations of the invention are actually statements written in a programming language. Such programming language statements, when executed by a computer, cause the computer to act in accordance with the particular content of the statements. Furthermore, the software that enables a computer system to act in accordance with the invention may be provided in any number of forms including, but not limited to, original source code, assembly code, object code, machine language, compressed or encrypted versions of the foregoing, and any and all equivalents.

One of skill in the art will appreciate that "media", or "computer-readable media", as used here, may include a floppy, a diskette, a tape, a compact disc of any format, an integrated circuit, a ROM, a cartridge, a memory stick or a medium readable by computers now known or hereafter developed. For example, to supply software for enabling a computer system to operate in accordance with the invention, the supplier might provide a diskette. Thus, the term, "computer readable medium" is intended to include all of the foregoing and any other medium by which software may be provided to a computer. Alternatively, the software may be supplied to a computer system via satellite transmission, via a direct telephone link, or via the Internet.

Although the enabling software might be "written on" a diskette, "stored in" an integrated circuit, or "carried over" a communications circuit, it will be appreciated that, for the purposes of this application, the software will be referred to simply as being "on" the medium. Thus, the term "on" is intended to encompass the above and all equivalent ways in which software is associated with a computer usable medium.

For the sake of simplicity, therefore, the term "program product" is thus used to refer software on a computer readable medium, as defined above, to enable a computer system to operate according to the above-identified invention now described in various embodiments.

Combinational Logic

Combinational logic includes one or more logic gates but does not include such units that have memory capabilities. Logic gates include, but are not limited to, NOT gate, AND gate, OR gate, NAND gate, NOR gate, XOR gate, AND-OR gate, OR-AND gate, EXNOR gate, multiplexer, and demultiplexer.

EMBODIMENTS

The invention, in one aspect, provides a method for efficiently identifying contention and/or float conditions on buses used in integrated circuits (IC). A bus is an electrical conductor capable of receiving signals from a plurality of sources connected to the bus. Each of these sources includes an enable condition that, when active, allows a particular source to drive data onto the bus. When two or more sources propagate data onto the bus simultaneously, a contention occurs. The method provided simulates input combinations and detects whether there is a possibility of a bus contention. The method is further capable of detecting the case where none of the sources is driving the bus. This is referred to as a bus float. In addition, the method provided is targeted for design for test (DFT) circuits, therefore using this method allows the designer to identify from the RTL description a contention that may occur only in test. The method also provides the designer with the data conditions that cause the contention.

The concept of a cone of influence will now be briefly discussed. A cone of influence can be thought of in two directions. In a backward cone of influence of a particular point in a logic netlist, the cone includes components and/or inputs that have an influence on a value at the particular point. In a forward cone of influence of the point, the cone includes components and/or outputs that the value at the point has an influence on. In this description, the focus is primarily on the backward cones of bus drivers.

Reference is now made to FIG. 1 where an exemplary schematic diagram of combinational logic enabling drivers for driving data on a bus is shown. Bus 140 is connected to a plurality of drivers 130 each capable of transferring a signal onto bus 140 based on an enable signal ENi 135, where the index "i" denotes the specific driver number being enabled. Each Eni, when active, allows a signal to flow from its respective input signal 115 onto bus 140. Each ENi 135 signal is an output of logic unit 120 that contains N combinational logic cones (CLCs) 125-1 through 125-N and M inputs 110-1 through 110-M. The inputs 110 are either actual inputs to a device or the outputs of flip-flops, both of which will be referred to, for the sake of convenience, simply as device inputs. In no event will memory units such as flip-flops, whether directly placed or indirectly created, be included in combinational logic 120. CLCs 125 are combinatorial interconnects of logical gates such as AND gates, OR gates, NAND gates, NOR gates, NOT gates, and XOR gates to name a few, but specifically exclude memory components such as memory cells, flip-flops, combinational logic loops that form a defacto memory, and the like. As a result of the natural behavior of combinatorial logic interconnects, some of CLCs' 125 inputs are common among two or more of CLC 125. Drivers 130-1 through 130-N are enabled by CLCs 125-1 through 125-N respectively.

It may be said that a device input (keeping in mind that "device input" refers to actual device inputs or outputs of memory components) is a cone-input of a given driver when the input can have an influence on the driver's value. It may also be said that a logic component is included in the combinational logic cone of a given driver when the component is in the backward cone of influence of the driver.

As mentioned above, a contention occurs if two or more ENi signals are active simultaneously. A bus float occurs if all ENi signals are inactive.

In order to detect contention on bus 140, the method calls for several steps to take place. First a driver 130-$i$ is selected. Then, all the inputs 110 that determine the output of that CLC 125-$i$ are found. These inputs are a subset of inputs 110 and for the purpose of this invention are defined as "cone-inputs". All inputs 110 which are not cone-inputs are assigned a "don't care" (Ø) value. A don't care value is a signal with an undetermined value, i.e., it may have the value of "0" or "1". Now, the enable signals ENi 135 are all checked while only the cone-inputs of CLC 125-$i$ are assigned the entire range of possible values, each such value checked separately. For example, if the cone-inputs are inputs 110-1 through 110-5, the cone-inputs are assigned the range of combinations, and Ø values are assigned to inputs 110-6 through 110-M. The number of different cone-input combinations is equal to $2^m$, where m is the number of inputs belonging to a specific set of cone-inputs. If two or more of ENi 135 have an active value, resulting from a particular value assignment to the cone inputs, then a contention may occur. Moreover, if, for some assignment of values to the cone inputs, none of ENi 135 are active, then none of the drivers 130 drive the bus and a bus float condition is detected. For each logic combination that causes a bus contention, the input combination that caused the contention, as well as all drivers 130 that output active values to the enable signal 135, are reported to the user. It is further possible that the RTL statement(s) that caused the contention are returned as part of the error message. The sequence is repeated for all logic combination of the "cone-inputs." A more detailed flow chart of the method is shown in FIG. 2.

By applying the logic combinations on only one of the cone-inputs, the number of the required simulations is significantly reduced. For example, there are M inputs to unit 120 and m cone inputs to a selected CLC, where m is normally smaller, or significantly smaller than M, the number of input combinations assigned to the selected cone-inputs is equal to $2^m$. Using prior art approaches would require $2^M$ simulations.

Figure 2:
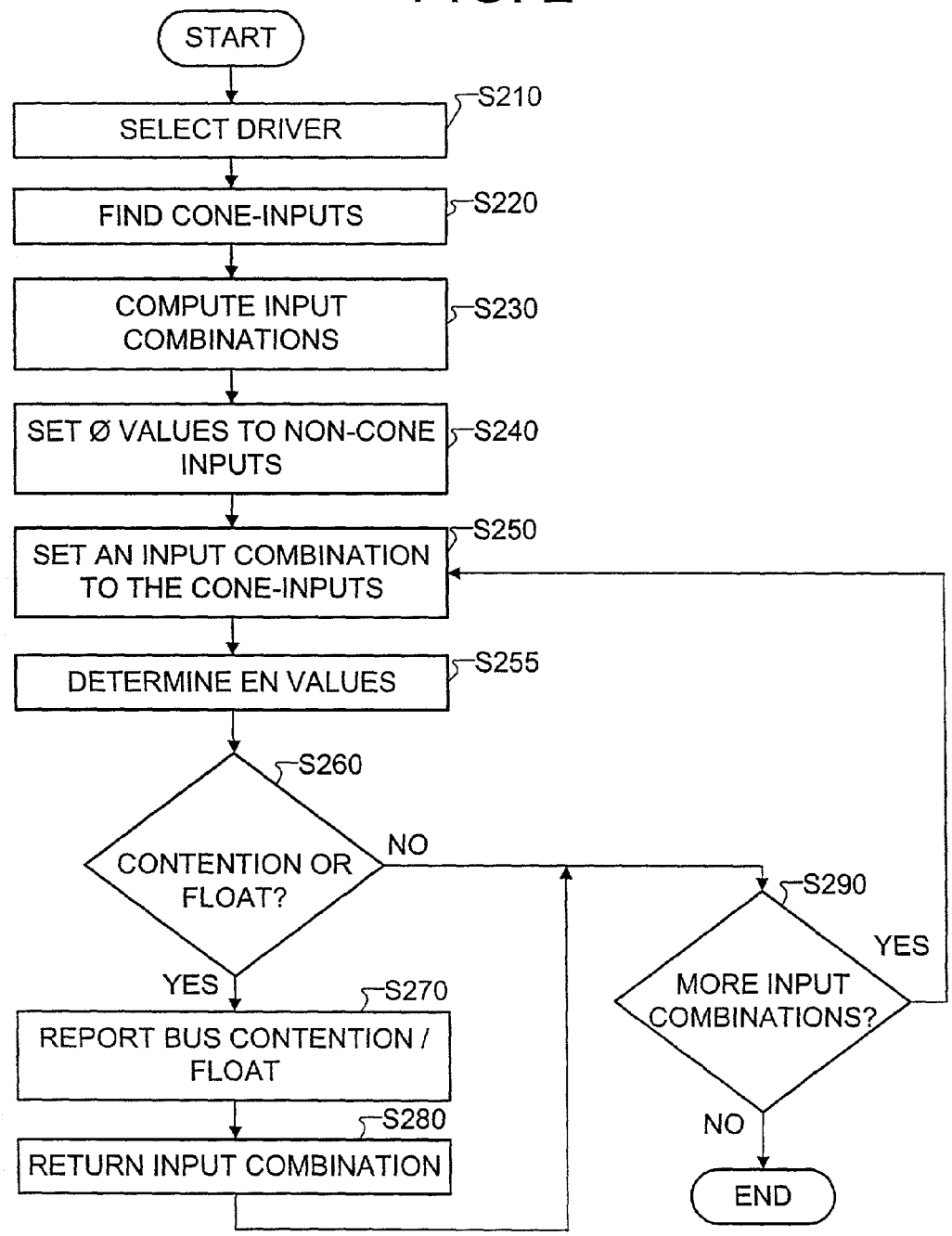
FIG. 2 is an exemplary flowchart of an algorithm according to the invention for detecting bus contention.

Reference is now made to FIG. 2 where an exemplary embodiment of an algorithm 200, used for determining bus contention from RTL description, is shown. In step S210, one of drivers 130 is selected. In step S220 the cone-inputs for the selected driver 130 are found. These are inputs 110 which belong to a CLC 125 that enables the selected driver 130. In step S230 all of the possible input combinations for the cone-inputs of the selected CLC 125 are found. The number of possible input combinations is $2^m$, where m is the number of inputs 110 belonging to the specific set of cone-inputs for the selected driver. In step S240, all inputs 110 which are not part of the cone-inputs are assigned with Ø values. In step S250, one of the input combinations, computed in step S230, is applied to the cone-inputs, followed by step S255 where the resulting value of each EN 135 of drivers 130 is calculated. In step S260, it is determined if there are two or more EN 135 signals that are active or none of EN 135 signals are active. If step S260 yields an affirmative answer, then in step S270 a bus contention is reported or a bus float is reported. In step S280, the input combination and drivers 130 that are involved in the contention are reported as part of an error message. It is further possible that the return message further includes the RTL statement(s) that caused the bus contention. This can be done simply by using those equations of the input cone that drive an Eni to its undesirable value.

If step S260 yielded a negative response, then in step S290 it is determined if there are more input combinations to be assigned to the cone-inputs. If there are, execution continues with step S240. Otherwise, the simulation is completed.

Although several specific steps are shown in FIG. 2 and described above, it will be appreciated that the order can in some cases be changed according to the needs of the situation, and that other steps can of course be added.

Reference is now made to FIG. 3 where a non-limiting example of the use of the disclosed method is shown. FIG. 3A shows a combinational logic that comprises two CLCs 310 and 320. CLCs 310 and 320 enable drivers 330-1 and 330-2 respectively. CLC 310 includes an AND gate 314 and its inputs are 300-1 and, 300-2. CLC 320 includes a XOR gate 324 and its inputs are also 300-1, and 300-2.

According to the method described in FIG. 2, in step S210 one of drivers 330-1 or 330-2 is selected. For the purpose of this non-limiting example assume that driver 330-1 is selected in this step. In step S220 the cone-inputs of driver 330-1 are found, which are inputs 300-1 and 300-2, belonging to cone 310. In step S230 all possible input combinations to be assigned to the cone-inputs are found. In this case there are only four different input combinations: 00, 01, 10 and 11. In step S240 all inputs not belonging to CLC 310 are assigned Ø values. In this example all inputs belong to CLC 310 and therefore no such value is assigned. In step S250 a cone-input is assigned from the possible combinations, starting with the input vector identified in the table as sequence "0" which has values "00", to inputs 300-1 and 300-2. In step S255 the values of ENi are determined. These can be seen in the table of FIG. 3b (columns 335-1 and 335-2 in the table). In step S260 the signal values on $EN_1$ 335-1 and $EN_2$ 335-2 are checked. For the combination "00" which is the first sequence marked as sequence "0" in FIG. 3B, EN1 is "0" and EN2 is also "0". This situation is a case where no driver is driving the bus and potentially is an undesirable situation which is now detected. Operation therefore continues with step S270 where the error condition is reported and S280 that returns the specific input combination that has caused the faulty situation. The execution then continues with step S290, which is also reached from step S260 if no contention or float situation is detected.

It should be noted that one of the input signals is potentially a signal bringing the system into test mode. For example, assuming the input 300-1 is a test mode signal activating test mode when it is low, then it is clear that, in normal operation of the device, the system would function properly and the problem would occur in only test mode. Contrary to the approaches evident in the patents mentioned in the background section, the embodiment of the invention being described now allows for the simple detection of design errors in test mode, without requiring the full dynamic simulation of the device in both operation mode as well as in test mode. The result is a significant reduction in test time as well as in easy debugging of float and contention conditions of a bus.

In Step S290 it is checked if all sequences for the cone-inputs have been checked. Here, it must be noted that the term "sequence" as used here does not mean that the values applied to the combinational logic are applied in any certain order; instead, "sequence" is simply a convenient way of describing a set of values to be applied and may be understood to be an input vector. As in this example the answer would be "no" so execution continues with step S240 were the next sequence, namely sequence "1" with values "01", is selected and checked. The full results are shown in FIG. 3B and specifically no contention or float situations are detected in these remaining cases. A person skilled in the art could now easily identify the cause of the problem and fix it as may be desirable.

Figures 4A, 4B:
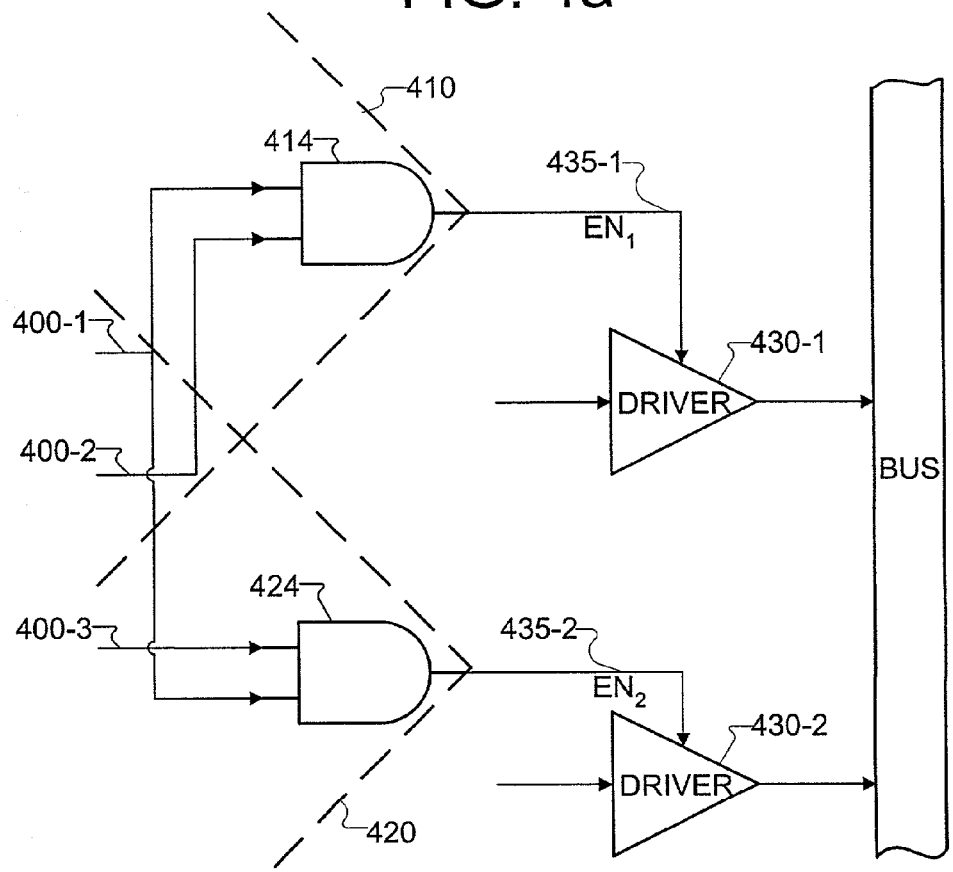

Reference is now made to FIG. 4A where another non-limiting example of a circuit to be tested in accordance with the disclosed method is shown. According to the method described in FIG. 2, in step S210 one of drivers 430-1 or 430-2 is selected. For the purpose of this non-limiting example assume that driver 430-1 is selected in this step. In step S220 the cone-inputs of driver 430-1 are found, which are inputs 400-1 and 400-2, belonging to cone 410. In step S230 all possible input combinations to be assigned to the cone-inputs are found. In this case there are only four different input combinations: 00, 01, 10 and 11. In step S240, all inputs not belonging to CLC 310 are assigned Ø values. In this example this value is assigned to input 400-3 which does not belong to CLC 410. In step S250 a cone-input is assigned from the possible combinations, starting with sequence "0" having input values "00" applied to inputs 400-1 and 400-2. In step S255 the values of ENi are determined. These can be seen in the table of FIG. 4b (columns 435-1 and 435-2). In step S260 the signal values on $EN_1$ 435-1 and $EN_2$ 435-2 are checked. For the combination "00" which is the first sequence marked as sequence "0" in FIG. 4B, $EN_1$ is "0" and $EN_2$ is also "0". This is again a situation of a float as explained above. Operation therefore continues with step S270 where the error condition is reported and S280 that returns the specific input combination that has caused the faulty situation. The execution then continues with step S290, which is also reached from step S260 if no contention or float situation is detected. In Step S290 it is checked if all sequences for the cone-inputs have been checked. As in this example the answer would be "no" so execution continues with step S240 where sequence "1" having values "01", is selected and checked. The full results are shown in FIG. 4B where another case of a float condition is shown for the input "01" regardless of the value of input 400-3. Now sequence "2" with the input values "10" is checked and while $EN_1$ is "0" and the value for $EN_2$ is undetermined. Hence, there is a possibility of a float condition if the value of 400-3 is a "0" or, if a "1" is placed on input 400-3 then $EN_2$ is enabled while EN1 is off, which is a permitted case. The last sequence to be checked is that of sequence "3" having values "11" applied to inputs 400-1 and 400-2. In this case $EN_1$ has the value of "1" while $EN_2$ may receive either a value of "0" or a value of "1". If input 400-3 receives a value of "0" then only $EN_1$ is enabled while $EN_2$ is off, however, if input 400-3 receives a value of "1" both $EN_1$ and $EN_2$ will be enabled causing a contention on the bus. As all these situations are reported, a person skilled in the art could now easily identify the cause of the problem and fix it as may be desirable.

Many variations to the above-identified embodiments are possible without departing from the scope and spirit of the invention.

There is claimed:

1. A method of detecting a bus contention on a bus from register transfer level (RTL) description of a device, wherein said bus is controlled by combinational logic having a plurality of inputs, and said combinational logic controlling a plurality of drivers driving said bus, the method comprises the steps of:
   a) selecting a single driver from said plurality of drivers;
   b) finding cone-inputs that control said single driver;
   c) computing all logic combinations for said cone-inputs;
   d) assigning an undefined value to all inputs that are not said cone-inputs;
   e) assigning one of said logic combinations not assigned before to said cone-inputs;
   f) determining the value of each enable signal of said drivers;
   g) checking for a bus error condition on said bus;
   h) checking whether there are more said logic combinations to be assigned and if so continuing with step e); and
   i) generating a bus contention error report.

2. The method of claim 1, wherein said error condition is at least one of: contention, float.

3. The method of claim 1, wherein said generating a bus contention error report further comprises: returning said logic combination that caused said bus error condition.

4. The method of claim 3, wherein said generating a bus contention error report further comprises returning at least one RTL statement that introduced said bus error condition.

5. The method of claim 2, wherein said contention is the case where two or more of said drivers are simultaneously enabled.

6. The method of claim 2, wherein said float is the case where none of said plurality of drivers is enabled.

7. The method of claim 1, wherein said method is performed when said device is in test mode.

8. The method of claim 1, wherein said cone-inputs are a subset of said combinational logic inputs.

9. The method of claim 1, wherein said cone-inputs are inputs that at least affect said selected driver.

10. The method of claim 1, wherein said cone-inputs are connected to at least a portion of said combinational logic.

11. The method of claim 1, wherein said combinational logic may farther comprise at least one of such gates as: NOT gate, AND gate, OR gate, NAND gate, NOR gate, XOR gate, AND-OR gate, OR-AND gate, EXNOR gate, multiplexer, demultiplexer.

12. The method of claim 1, wherein said logic combinations comprise all the possible combinations of values to be assigned to said cone-inputs.

13. The method of claim 1, wherein said undefined value may be one of: active value or inactive value.

14. The method of claim 1, wherein said method first determines if a cone-input enables a test mode.

15. The method of claim 14, wherein said method further comprises the step of simulating test conditions prior to commencing with step a) of said method.

16. A computer readable medium storing a plurality of instructions comprising an executable code for controlling a computer for detecting a bus contention on a bus from register transfer level (RTL) description of a device, wherein said bus is controlled by combinational logic having a plurality of inputs, and said combinational logic controlling a plurality of drivers driving said bus, said executable code comprises the steps of:
   a) selecting a single driver not previously selected from said plurality of drivers;
   b) finding cone-inputs that control said single driver;
   c) computing all logic combinations for said cone-inputs;
   d) assigning an undefined value to all inputs that are not said cone-inputs;
   e) assigning one of said logic combinations not assigned before to said cone-inputs.
   f) determining the value of each enable signal of said drivers;
   g) checking for a bus error condition on said bus;
   h) checking whether there are more said logic combinations to be assigned and if so continuing with step e); and
   i) generating a bus contention error report.

17. The computer readable medium of claim 16, wherein said error condition is at least one of: contention, float.

18. The computer readable medium of claim 16, wherein said generating a bus contention error report further comprises: returning said logic combination that caused said bus error condition.

19. The computer readable medium of claim 18, wherein said generating a bus contention error report further comprises returning at least one RTL statement that introduced said bus error condition.

20. The computer readable medium of claim 17, wherein said contention is the case where two or more of said drivers are simultaneously enabled.

21. The computer readable medium of claim 17, wherein said float is the case where none of said plurality of drivers is enabled.

22. The computer readable medium of claim 16, wherein said executable code is performed when said device is in test mode.

23. The computer readable medium of claim 16, wherein said cone-inputs are a subset of said combinational logic inputs.

24. The computer readable medium of claim 16, wherein said cone-inputs are inputs that at least affect said selected driver.

25. The computer readable medium of claim 16, wherein said cone-inputs are connected to at least a portion of said combinational logic.

26. The computer readable medium of claim 16, wherein said combinational logic may further comprise at least one of: NOT gate, AND gate, OR gate, NAND gate, NOR gate, XOR gate, AND-OR gate, OR-AND gate, EXNOR gate, multiplexer, demultiplexer.

27. The computer readable medium of claim 16, wherein said logic combinations comprise all possible combinations of values to be assigned to said cone-inputs.

28. The computer readable medium of claim 16, wherein said undefined value may be one of: active value or inactive value.

29. The computer readable medium of claim 16, wherein said executable code first determines if a cone-input enables a test mode.

30. The computer readable medium of claim 29, wherein said executable code further comprises the step of simulating test conditions prior to commencing with step a) of said method.

31. A design test method, comprising:
   selecting, from a register transfer level (RTL) description of a device, only one driver of a plurality of drivers controlling a bus, each said driver having a respective driver enable signal and having a respective combinational logic cone controlling the driver enable signal;

identifying, from among M inputs of the device, a set of m cone inputs influencing a value of the selected driver;

applying only $2^m$ logic combinations to the cone inputs, with undefined values being applied to all inputs that are not cone inputs, so as to obtain for each logic combination a corresponding set of enable signal values for each one of the plurality of drivers;

determining a bus error condition based on the set of enable signal values;

identifying bus error conditions based on the set of enable signal values; and, generating a bus contention error report.

32. The design test method as set forth in claim 31, further comprising repeating said selecting, identifying, applying, determining, and identifying bus error conditions steps for each of the plurality of drivers.

33. The design test method as set forth in claim 31, wherein the bus error condition indicates the presence of one of a bus contention condition and a bus float condition.

34. The design test method as set forth in claim 31, wherein the combinational logic cone is determined so as to be free of memory components.

35. The design test method as set forth in claim 31, further comprising, in the combinational logic cone, test mode circuitry.

36. A computer system adapted to implement a design test method, comprising:

a processor, and a memory including software instructions to enable the computer system to perform the steps of:

selecting, from a register transfer level (RTL) description of a device, only one driver of a plurality of drivers controlling a bus, each said driver having a respective driver enable signal and having a respective combinational logic cone controlling the driver enable signal;

identifying, from among M inputs of the device, a set of m cone inputs influencing a value of the selected driver;

applying only $2^m$ logic combinations to the cone inputs, with undefined values being applied to all inputs that are not cone inputs, so as to obtain for each logic combination a corresponding set of enable signal values for each one of the plurality of drivers;

identifying bus error conditions based on the set of enable signal values; and generating a bus error condition report.

37. The computer system as set forth in claim 36, the steps comprising repeating said selecting, identifying, applying, and identifying bus error conditions steps for each of the plurality of drivers.

38. The computer system as set forth in claim 36, wherein identifying bus error conditions indicates the presence of one of a bus contention condition and a bus float condition.

39. The computer system as set forth in claim 36, wherein the combinational logic cone is determine so as to be free of memory components.

40. The computer system as set forth in claim 36, the steps further comprising, in the combinational logic cone, test mode circuitry.

41. A computer program product, for enabling a computer to implement a design test method, comprising:

a computer readable medium;

computer executable instructions on the computer readable medium, defining computer operations including:

selecting, from a register transfer level (RTL) description of a device, only one driver of a plurality of drivers controlling a bus, each said driver having a respective driver enable signal and having a respective combinational logic cone controlling the driver enable signal;

identifying, from among M inputs of the device, a set of m cone inputs influencing a value of the selected driver;

applying only $2^m$ logic combinations to the cone inputs, with undefined values being applied to all inputs that are not cone inputs, so as to obtain for each logic combination a corresponding set of enable signal values for each one of the plurality of drivers;

identifying bus error conditions based on the set of enable signal values; and generating a bus error condition report.

42. The computer program product as set forth in claim 41, the operations further comprising repeating said selecting, identifying, applying, and identifying bus error conditions operations for each of the plurality of drivers.

43. The computer program product as set forth in claim 41, wherein the identifying bus error conditions indicates the presence of one of a bus contention condition and a bus float condition.

44. The computer program product as set forth in claim 41, wherein the combinational logic cone is determined so as to be free of memory components.

45. The computer program product as set forth in claim 41, the operations further comprising in the combinational logic cone, test mode circuitry.

* * * * *